(12) United States Patent
Neaves et al.

(10) Patent No.: US 7,352,201 B2
(45) Date of Patent: Apr. 1, 2008

(54) SYSTEM AND METHOD FOR TESTING DEVICES UTILIZING CAPACITIVELY COUPLED SIGNALING

(75) Inventors: Philip Neaves, Surrey (GB); Andrew Lever, Surrey (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/371,524

(22) Filed: Mar. 8, 2006

(65) Prior Publication Data

US 2006/0152243 A1 Jul. 13, 2006

Related U.S. Application Data

(62) Division of application No. 11/140,083, filed on May 26, 2005, now Pat. No. 7,183,790, which is a division of application No. 10/691,020, filed on Oct. 21, 2003, now Pat. No. 7,112,980.

(30) Foreign Application Priority Data

Aug. 21, 2003 (GB) ................................ 0319680.5

(51) Int. Cl.
*G01R 31/26* (2006.01)
(52) U.S. Cl. ................................... 324/765
(58) Field of Classification Search ................. 324/763, 324/754, 765, 658, 686, 537, 158.1; 257/48; 714/25, 736, 737
See application file for complete search history.

(56) References Cited

U.S. PATENT DOCUMENTS 3,782,504 A 1/1974 Billmaier et al. ......... 187/29 R 4,280,221 A 7/1981 Chun et al. .................... 375/17

(Continued)

FOREIGN PATENT DOCUMENTS

EP 0 277 764 A3 1/1988

(Continued)

OTHER PUBLICATIONS

"International Technology Roadmap for Semiconductors", Assembly and Packaging, 2001, pp. 1-21.

(Continued)

*Primary Examiner*—Ha Tran Nguyen
*Assistant Examiner*—Tung X. Nguyen
(74) *Attorney, Agent, or Firm*—Dorsey & Whitney, LLP

(57) ABSTRACT

An apparatus and method for testing a semiconductor device in an AC test regime. The test apparatus includes a test plate capacitively couple to the signal terminals of the integrated circuit. The test plate is coupled to a test receiver circuit to receive and output the data signal detected at the test plate capacitively coupled to the signal terminals. Alternatively, the test plate is coupled to a test transmitter circuit to transmit data signals to signal terminals through the capacitively coupled test plate. A test unit can be coupled to the semiconductor device to evaluate the detected data signal against test criteria. Testing and evaluation is accomplished by capacitively coupling a test plate to a plurality of signal terminals. Data signals transmitted from a signal terminal and detected by the test plate or transmitted from the test plate and detected by the signal terminals are evaluated against a test criteria.

6 Claims, 3 Drawing Sheets

U.S. PATENT DOCUMENTS

| | | | |
|---|---|---|---|
| 5,124,660 A * | 6/1992 | Cilingiroglu | 324/538 |
| 5,673,130 A | 9/1997 | Sundstrom et al. | 359/158 |
| 5,786,979 A | 7/1998 | Douglass | 361/328 |
| 5,818,112 A | 10/1998 | Weber et al. | 257/777 |
| 5,942,911 A * | 8/1999 | Motika et al. | 324/769 |
| 5,974,464 A | 10/1999 | Shin et al. | 709/231 |
| 6,087,842 A * | 7/2000 | Parker et al. | 324/763 |
| 6,188,232 B1 | 2/2001 | Akram et al. | 324/755 |
| 6,242,941 B1 * | 6/2001 | Vest et al. | 326/26 |
| 6,285,201 B1 | 9/2001 | Farnworth et al. | 324/755 |
| 6,310,494 B1 | 10/2001 | Ehben et al. | 326/82 |
| 6,357,025 B1 | 3/2002 | Tuttle | 714/724 |
| 6,368,930 B1 | 4/2002 | Enquist | 438/320 |
| 6,396,292 B2 | 5/2002 | Hembree et al. | 324/755 |
| 6,407,566 B1 | 6/2002 | Brunelle et al. | 324/758 |
| 6,425,107 B1 | 7/2002 | Caldara et al. | 714/759 |
| 6,490,188 B2 | 12/2002 | Nuxoll et al. | 365/63 |
| 6,496,889 B1 | 12/2002 | Perino et al. | 710/110 |
| 6,500,696 B2 | 12/2002 | Sutherland | 438/109 |
| 6,563,133 B1 | 5/2003 | Tong | 257/52 |
| 6,563,299 B1 | 5/2003 | Van Horn et al. | 324/158.1 |
| 6,620,638 B1 | 9/2003 | Farrar | 438/14 |
| 6,625,073 B1 | 9/2003 | Beffa | 365/201 |
| 6,690,309 B1 | 2/2004 | James et al. | 341/102 |
| 6,714,031 B2 * | 3/2004 | Seki | 324/763 |
| 6,859,883 B2 | 2/2005 | Svestka et al. | 713/320 |
| 6,937,067 B2 | 8/2005 | Neaves | 326/93 |
| 2001/0039075 A1 | 11/2001 | Doyle et al. | 438/107 |
| 2001/0054908 A1 | 12/2001 | Farnworth et al. | 324/755 |
| 2005/0077546 A1 | 4/2005 | Neaves | 257/210 |
| 2005/0280444 A1 | 12/2005 | Neaves | 326/93 |

FOREIGN PATENT DOCUMENTS

| | | |
|---|---|---|
| EP | 0 366 263 A3 | 5/1990 |
| EP | 0 492 806 A3 | 11/1991 |
| EP | 0 805 356 A3 | 4/1998 |
| GB | 2 353 401 A | 2/2001 |
| GB | 2 353 402 A | 2/2001 |
| WO | WO 0215185 A1 | 2/2002 |

OTHER PUBLICATIONS

Karnezos, M. et al., "System in a Package (SiP) Benefits and Technical Issues", in *Proceedings of* APEX, San Diego, California, 2002, 7 pages.

Mick, S. et al., "4Gbps High-Density AC Coupled Interconnection", Department of Electrical and Computer Engineering North Carolina State University, IEEE Custom Integrated Circuits Conference, May 12-16, 2002, pp. 133-140.

"Rapidly Advancing System-in-Package Fabrication Technology", vol. 20, No. 3, 2002, pp. 3-11.

Scanlan, C.M. et al., "System-In-Package Technology, Application and Trends", 2001 Proceedings of SMTA International, Rosemont, Illinois, pp. 764-773.

Wang, M. et al., "Configurable Area-IO Memory for System-In-A-Package (SiP)", 27th European Solid-State Circuits Conference, Sep. 2001, 4 pages.

* cited by examiner

SYSTEM AND METHOD FOR TESTING DEVICES UTILIZING CAPACITIVELY COUPLED SIGNALING

CROSS-REFERENCE TO RELATED APPLICATIONS

This application is a divisional of U.S. patent application Ser. No. 11/140,083, filed May 26, 2005 now U.S. Pat. No. 7,183,790, which is a divisional of U.S. patent application Ser. No. 10/691,020, filed Oct. 21, 2003 now U.S. Pat. No. 7,112,980, which claims the benefit of United Kingdom Patent Application No. 0319680.5, filed Aug. 21, 2003.

TECHNICAL FIELD

The present invention is related to testing semiconductor devices, and more particularly, to a system and method for testing semiconductor devices utilizing capacitively coupled signaling, such as in a system-in-package device.

BACKGROUND OF THE INVENTION

Traditional semiconductor integrated circuit technology is used to integrate various electronic circuits onto a common semiconductor substrate to form a system, or subsystem. However, the traditional approach to integrating circuits into a system has process, manufacturing and design limitations which make integrating some electronic circuitry onto a common semiconductor substrate impractical. A new integration technology, namely, system-in-package (SiP) technology, attempts to overcome the limitations of the traditional approach by interconnecting multiple discrete semiconductor systems on a common substrate and encapsulating the complete system in a common package. Generally, SiP enables the integration of a mix of technologies into one package that would otherwise be difficult and expensive using the traditional approach. For example, SiP technology has been successfully applied in mixed signal applications, such as RF/wireless applications and sensor applications, as well as in networking and computing applications, and other high speed digital applications.

As previously mentioned, the multiple discrete systems of a SiP are electrically coupled together to form a system and, as is well known in the art of digital electronics, many of the multiple systems communicate with one another by transmitting digital information in the form of electrical signals. Typically, even analog based systems included in the SiP have the analog signals converted into the digital domain. The electrical signals transmitted between the multiple systems represent a serial data stream where the data is represented as binary symbols having discrete levels of amplitude or phase, as well known. Multiple electrical signals are transmitted in parallel to transmit data of a data width, with each signal representing one bit of the width of data. In transmitting the data, the electrical signal is often distorted by various phenomena, such as noise, signal strength variations, phase shift variations, and the like. Additionally, in a SiP device, where multiple individual devices interact, the various devices may operate in different voltage domains and potentially cause electrical currents to flow from one system to another. Not only do the currents result in unwanted current (i.e., power) consumption, in some cases the current may be great enough to cause damage to one of the devices.

In response, SiP devices have employed capacitively coupled signaling between the multiple systems to filter noise from the electrical signals and also prevent current flow between devices operating in different voltage domains. FIG. 1 illustrates a capacitively coupled signaling system having a capacitively coupled data bus 110 n-bits wide that is used to transmit data signals D_OUT0-D_OUTn. The data bus 110 includes output driver circuits, or transmitters 112 of the transmitting device capacitively coupled through capacitors 118 to input buffer circuits, or receivers 114 at the receiving device. The received data has been represented by the received data signals D_IN0-DINn. As shown in FIG. 1, the data bus 110 has been illustrated as a uni-directional data bus, with the transmitters 112 representing a transmitting device and the receivers 114 representing a receiving device. However, it will be appreciated that the data bus 110 has been illustrated in this manner by way of example, and that the data bus 110 can be a bi-directional data bus as well.

Lower power is consumed when utilizing capacitively coupled signaling since there is only minimal leakage current between devices. Capacitively coupled signaling is also insensitive to voltage domains, allowing operation without the need for level shifting. That is, a capacitively coupled signaling system blocks the DC component but transfers the AC component. Additionally, circuits designed for protection from electrostatic discharge are no longer necessary where the signaling is entirely contained within the SiP device. Load requirements on output circuitry can also be relaxed compared with conventional off-die signaling because the need to drive signals external to the device package are eliminated for those signals that remain internal to the SiP device.

In fabricating SiP devices, and as with other semiconductor devices, it is desirable for the individual devices to be tested to ensure that they will be operable in a SiP device before being bonded together. Otherwise, if it is determined subsequent to bonding that one of the devices will fail when operated in the capacitively coupled signaling environment, the entire SiP will need to be scrapped, or subject to rework, which subjects the remaining functional devices to greater potential for damage. Moreover, it is desirable to test a semiconductor device as it will be used in the SiP environment, that is, testing the device for functionality in a capacitively coupled signaling system by performing AC functional testing on the device.

Therefore, there is a need for a system and method for testing device that will be used in a system utilizing capacitively coupled signaling.

SUMMARY OF THE INVENTION

The present invention provides an apparatus and method for testing a semiconductor device in an AC test regime. In one aspect of the invention, testing and evaluation is accomplished by capacitively coupling a test plate to a plurality of signal terminals from which data signals are transmitted, transmitting a data signal from one of the plurality of signal terminals, and evaluating the data signal detected by the test plate against a test criteria. In another aspect of the invention, testing and evaluation is accomplished by capacitively coupling a test plate to a plurality of signal terminals at which data signals are received, transmitting a data signal from the test plate to one of the plurality of signal terminals, and evaluating the data signal detected by at the signal terminal against a test criteria.

In another aspect of the invention, an apparatus is provided for testing an integrated circuit having a plurality of signal terminals to which a corresponding plurality of transmitters are coupled, the transmitters applying a data signal to a respective signal terminal. The test apparatus includes a test plate capacitively couple to the signal terminals of the integrated circuit and a test receiver circuit coupled to the test plate to receive and output the data signal detected at the test plate capacitively coupled to the signal terminals. A test unit can be coupled to the test receiver circuit to evaluate the detected data signal against test criteria. In another aspect of the invention, a test apparatus is provided for an integrated circuit having a plurality of capacitively coupled signal terminals to which a corresponding plurality of receivers are coupled, the receivers generating a respective data signal in response to detecting a respective input data signal. The test apparatus includes a test plate capacitively couples to the signal terminals of the integrated circuit, a test transmitter circuit coupled to the test plate to transmit a data signal to at least one of the signal terminals through the capacitively coupled test plate, and a test unit coupled to the test signal terminals to evaluate the detected data signal against test criteria.

DETAILED DESCRIPTION OF THE INVENTION

Figure 2:
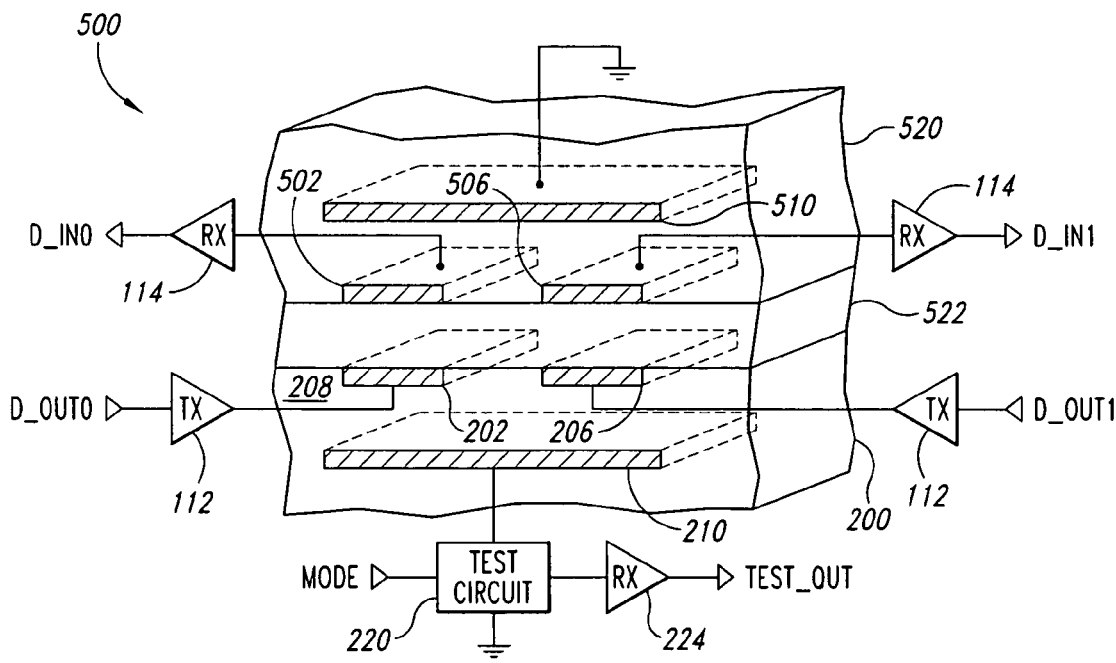
FIG. 2 is a partial isometric and cross-sectional view of a semiconductor structure of a system-in-package device including an embodiment of the present invention.

FIG. 2 is a partial isometric and cross-sectional view illustrating a portion of a SiP 500. It will be appreciated that the lateral sizes and thickness of the various layers illustrated in the accompanying figures are not drawn to scale and these various layers or layer portions may have been enlarged or reduced to improve drawing legibility. It will be further appreciated that in the following description, many of the processing steps discussed are understood by those of ordinary skill in the art, and detailed descriptions thereof have been omitted for the purposes of unnecessarily obscuring the present invention.

The SiP 500 includes a first semiconductor device, represented by semiconductor structure 200, capacitively coupled to a second semiconductor device, represented by a semiconductor structure 520. The semiconductor structures 200, 520 are capacitively coupled through a dielectric 522. As shown in FIG. 2, the semiconductor structure 200 is included in a first semiconductor device and the semiconductor structure 520 is included in a second semiconductor device. A more detailed description of the die-to-die bonding process used in forming the structure of the SiP 500 can be found in commonly assigned, UK Patent Application No. 0323992.8, entitled STRUCTURE AND METHOD FOR FORMING A CAPACITIVELY COUPLED CHIP-TO-CHIP SIGNALING INTERFACE to Neaves, which is incorporated herein by reference. In summary, signal pads 202, 206 are formed on the semiconductor structure 200, and signal pads 502, 506 are formed on the semiconductor structure 520, such that when bonding of the two devices occurs, the signal pads 202 and 502 are positioned to be capacitively coupled together, and the signal pads 206 and 506 are positioned to be capacitively coupled together. Thus, employing the die-to-die bonding technique described in the aforementioned co-pending U.S. patent application eliminates the need to use discrete capacitors in forming a capacitively coupled signaling system between the semiconductor structure 200 to the semiconductor structure 520.

As shown in FIG. 2, the semiconductor structure 200 represents an embodiment of the present invention which can be used with a capacitively coupled signaling system. FIG. 2 illustrates the semiconductor structure 200 implemented in a SiP 500 formed in accordance with the previously described co-pending U.S. Patent Application. The device on which the semiconductor structure 200 is included represents a transmitting device, and the device on which the semiconductor structure 520 is included represents a receiving device. Each of the signal pads 502, 506 are coupled to a respective receiver 114 that provides a data signal D_IN0, D_IN1, respectively. A grounded conductive plate layer 510 is formed in proximity to the signal pads 502, 506 to provide a well defined ground plane. In the semiconductor structure 200, the signal pads 202, 206 are coupled to a respective transmitter 112, each of which receives a data signal, D_OUT0, D_OUT1. A conductive plate layer 210 is formed in proximity of the signal pads 202, 206, and is separated therefrom by a dielectric material.

The terms "above," "over," and "below" are used herein to describe the positional relationship between a signal pad and a conductive plate layer in order to facilitate description of embodiments of the present invention. However, it will be appreciated by one ordinarily skilled in the art that the signal pad and conductive plate layer merely need to be formed in proximity to one another and separated by a dielectric material. Therefore, the particular arrangement described as being above, over, or below is not intended to limit the scope of the present invention.

The structure 200 can be formed using conventional semiconductor processes and materials well known by those ordinarily skilled in the art. For example, the conductive plate layer 210 can be formed on a first layer of a dielectric material by depositing a first layer of conductive material followed by masking and etching processes to form the plate 210. A second layer of dielectric material can then be formed over the conductive plate layer 210 to electrically insulate it from subsequently formed conductive layers. A second layer of conductive material can then be deposited on the dielectric material, masked, and then etched to form the signal pads 202, 206 over the underlying conductive plate layer 210. Another layer of dielectric material can be formed over the signal pads 202, 206 and subsequently etched back to expose the signal pads 202, 206. Alternatively, a damascene process can be used to form the signal pads 202, 206. A damascene process can be used to form the conductive plate layer 210, as well. Generally, in a damascene process a dielectric layer is masked and etched to form trenches therein. A layer of conductive material is formed to fill the trenches, and then etched back such that only the conductive material in the trenches remain.

It will be appreciated that the formation of the semiconductor structure 200 can be integrated into the fabrication process flow of conventional integrated circuits. For example, the conductive plate layer 210 and the signal pads 202, 206 can be formed as part of a conventional process for a semiconductor device having a multi-level metallization structure. Thus, the semiconductor structure 200 can be formed during the metallization process of a semiconductor device for use with a capacitively coupled signaling system.

Figure 1:
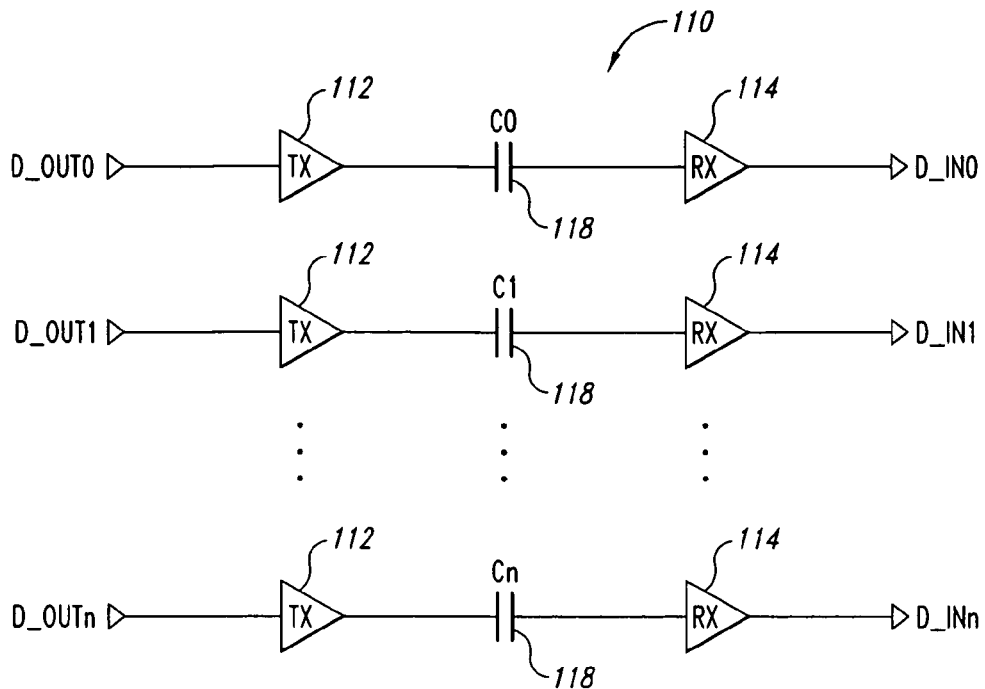
FIG. 1 is a schematic drawing of a conventional capacitively coupled data bus.

As previously mentioned, coupled to the signal pads 202, 206 are transmitters 112, to which an output data signal is applied. The transmitters 112 shown in FIG. 2 generally represent circuitry formed on the semiconductor device on which the semiconductor structure 200 is located. As shown in FIG. 2, a first data signal D_OUT0 is applied to the transmitter 112 and driven at the signal pad 202, and a second data signal D_OUT1 is applied to the transmitter 112 and driven at the signal pad 206. The D_OUT0 and D_OUT1 signals are representative of data signals that are generated by other circuitry (not shown) on the semiconductor device including the semiconductor structure 200. The signal pads 202, 206 are capacitively coupled to receivers 114 through the dielectric 522 and the signal pads 502, 506, respectively. As previously discussed with respect to FIG. 1, the receivers 114 represent circuitry located on the semiconductor device on which the semiconductor structure 522 is located. The receivers 114 generate output data signals D_IN0 and D_IN1 corresponding to the D_OUT0 and D_OUT1 signals, respectively.

It will be appreciated by those ordinarily skilled in the art that the signal driven on the signal pads 202, 206 can be other than data signals, for example, command signals and the like can be coupled to the signal pads 202, 206 as well. Such modifications can be made without departing from the scope of the present invention. It will be further appreciated by those ordinarily skilled in the art that although the semiconductor structure 200 is shown in FIG. 2 as being part of the transmitting device, that is, providing data signals D_OUT0 and D_OUT1 to a receiving device, electrical signals can be received at the signal pads 202, 206 as well, for example, from the semiconductor structures 520.

Coupled to the conductive plate layer 210 is a test circuit 220. The test circuit 220 is further coupled to a voltage reference, such as ground. The test circuit 220 receives a test mode signal MODE that is used to control the test circuit 220 to couple the conductive plate layer 210 to the ground, or to a test receiver 224. The test receiver 224 provides a test output signal TEST_OUT that can be provided to test equipment for evaluation. It will be appreciated that the test receiver 224 represents circuitry that can reside on the semiconductor device including the semiconductor structure 200, and that the test receiver 224 can be further coupled to test load circuitry, as well known in the art. The output of the test receiver 224 is preferably coupled to a conductive pad (not shown) of the semiconductor device that can be coupled to test equipment through the use of a conventional probe card. Additionally, the MODE signal is generated and provided to the test circuit 220 responsive to appropriate command signals applied to signal pads (not shown) of the semiconductor device on which the semiconductor structure 200 is located. The command signals can be applied by a test equipment to the semiconductor device via a conventional probe card. Use of such command signals and test modes, and generation of test mode signals are well known by those ordinarily skilled in the art.

During normal use, the MODE signal controls the test circuit 220 to couple the conductive plate layer 210 to ground. The conductive plate 210 is coupled to ground to provide the capacitors 118 of a capacitively coupled signaling system a well defined ground plane. However, as will be explained in more detail below, the conductive plate layer 210 can be used alternatively for the purpose of testing the functionality of a semiconductor device including the semiconductor structure 200 in an AC test regime. It will be appreciated that evaluation of the data signals driven on the signal pads 202, 206 subsequent to die-to-die bonding may be desirable in some situations. Additionally, where data is transmitted from the semiconductor structure 520 and received by the semiconductor structure 200, evaluation of the received signals may be desirable as well. Those ordinarily skilled in the art will have sufficient understanding from the description provided herein to practice the invention under either condition.

In an embodiment of the present invention, when a test mode is invoked by applying appropriate command signals to the semiconductor device, the MODE signal controls the test circuit 220 to couple the conductive plate layer 210 to the test receiver 224. Under this condition, the conductive plate layer 210 can be used as one plate of a capacitor having as its other plate the signal pad 202 or the signal pad 206. The "capacitor" dielectric is formed from the dielectric material 208 separating the signal pads 202, 206 and the conductive plate layer 210. In operation, a D_OUT signal is generated by circuitry on the semiconductor device having the semiconductor structure 200, and driven by the transmitter 112 onto a signal pad. For example, a D_OUT0 signal is generated and applied to the transmitter 112, which in turn drives the D_OUT0 signal on the signal pad 202. As the D_OUT0 signal is being driven on the signal pad 202, by virtue of the capacitive coupling of the signal pad 202 and the conductive plate layer 210, the test receiver 224 detects a capacitively coupled D_OUT0 signal and generates a corresponding TEST_OUT signal. As previously discussed, the output of the test receiver 224 can be applied to a conductive pad (not shown) that is coupled to test equipment. The TEST_OUT signal can then be evaluated by the test equipment to determine functionality of the semiconductor device on which the semiconductor structure 200 is included. Various characteristics of the TEST_OUT signal corresponding to the D_OUT0 signal can also be evaluated, as well known in the art, such as signal skew, slew rates, output levels, and the like. Significantly, however, is that the evaluation of the semiconductor device on which the semiconductor structure 200 is included, and the D_OUT0 signal itself, is made in an AC test regime through the capacitively coupling between the signal pad 202 and the conductive plate layer 210.

During the time the D_OUT0 signal is capacitively coupled to the conductive plate layer 210, the transmitter 112 coupled to the signal pad 206 is not driving the data signal D_OUT1. In one embodiment, the transmitter 112 coupled to the signal pad 206 is put into a high impedance state. It will be appreciated that in the embodiment shown in FIG. 2, the D_OUT1 signal should not be driven on the signal pad 206 during the evaluation of the D_OUT0 signal because the capacitive coupling between the signal pad 206 and the conductive plate layer 210 will result in interfering with the detection of only the D_OUT0 signal at the conductive player layer 210. As a result, the semiconductor structure 200 does not allow the D_OUT0 and D_OUT1 signals to be tested in an AC test regime concurrently. Testing of the D_OUT1 signal driven on the signal pad 206 can be made either before or after the evaluation of the D_OUT0 signal. Although the semiconductor structure 200 allows for only one data signal to be evaluated at one time, the semiconductor structure 200 has the benefit that it can be implemented simply without the need for including much additional circuitry.

It will be appreciated that the particular material and thickness of the dielectric material 208, and the dimensions of the conductive plate layer 210 and the signal pads 202, 206 will determine the characteristics of the capacitive coupling of the two during testing and evaluation. However, those ordinarily skilled in the art will have sufficient understanding based on conventional knowledge and the description provided herein to practice embodiments of the present invention. Thus, by applying well known principles of semiconductor processing and device design, the characteristics of the capacitive coupling between the conductive plate layer 210 and the signal pads 202, 206 can be tailored as desired. Such modifications remain well within the scope of the present invention.

Figure 3:
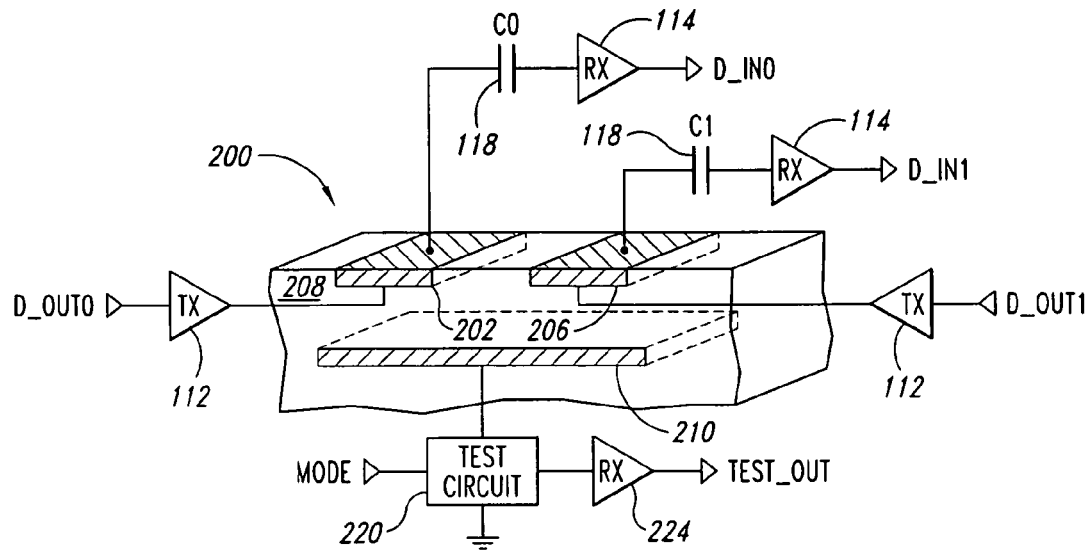
FIG. 3 is a partial isometric and cross-sectional view of a semiconductor structure according to an embodiment of the present invention for use in a capacitively coupled signaling system.

FIG. 3 illustrates the semiconductor structure 200 according to another embodiment of the present invention. In contrast to FIG. 2, the semiconductor structure 200 is shown in FIG. 3 prior to die-to-die bonding. As previously discussed, the semiconductor structure 200 includes first and second signal pads 202, 206 formed over a conductive plate layer 210 on a dielectric material 208. The signal pads 202, 206 are coupled to transmitters 112 which receive respective output data signals D_OUT0, D_OUT1. The conductive plate layer 210 is coupled to a test circuit 220. The test circuit 220 receives a test mode signal MODE and couples the conductive plate layer 210 to the ground or to a test receiver 224. The test receiver 224 provides a test output signal TEST_OUT that can be provided to test equipment for evaluation. The output of the test receiver 224 is preferably coupled to a conductive pad (not shown) of the semiconductor device that can be coupled to test equipment through the use of a conventional probe card. An advantage of the semiconductor structure 200 as shown in FIG. 3 is that testing and evaluation can be made under conditions that simulate the environment in which the semiconductor device will be used, prior to bonding the semiconductor device to another device, such as in a SiP device.

Figure 4:
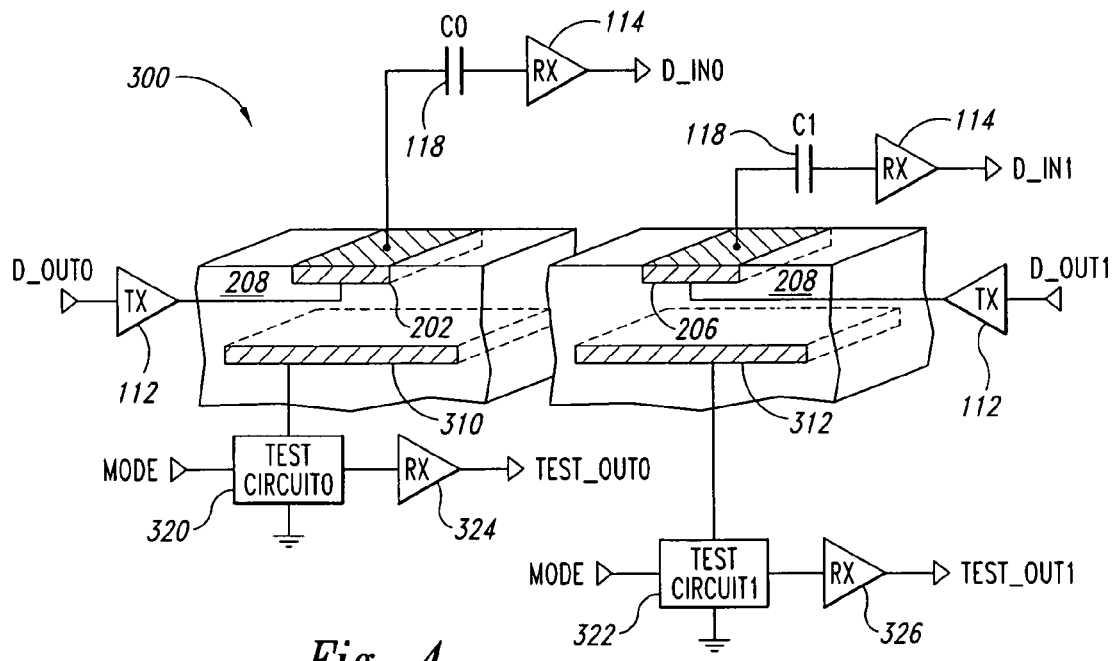
FIG. 4 is a partial isometric and cross-sectional view of a semiconductor structure according to another embodiment of the present invention for use in a capacitively coupled signaling system.

FIG. 4 illustrates a partial isometric and cross-sectional view of a semiconductor structure 300 according to another embodiment of the present invention which can be used with a capacitively coupled signaling system. The semiconductor structure 300 is similar to the semiconductor structure 200 of FIG. 3 in that a capacitor is formed between a conductive plate layer and a signal pad in order to provide testing in an AC test regime. However, in contrast to the semiconductor structure 200, which is illustrated as having only a single conductive plate layer 210, the semiconductor structure 300 includes a plurality of conductive plate layers 310, 312, each formed under at least one signal pad. As shown in FIG. 4, the conductive plate layer 310 is formed under the signal pad 202 and the conductive plate layer 312 is formed under the signal pad 206. Each of the signal pads 202, 206 are shown to be capacitively coupled to a respective receiver 114 through a respective capacitor 118 to represent the capacitive coupling of a semiconductor device including the semiconductor structure 300 to a receiving device (not shown) on which receivers 114 are located.

A dielectric material 208 that separates the signal pads 202, 206 from the conductive plate layers 310, 312, respectively, is used as a capacitor dielectric during testing of the semiconductor device including the semiconductor structure 300. It will be appreciated that the conductive plate layers 310, 312 should be located with respect to each other to avoid capacitive coupling. As shown in FIG. 4, conductive plate layers 310, 312 are separated from one another by a distance. Alternatively, it will be appreciated by those ordinarily skilled in the art, the conductive plate layers 310, 312 can be shielded from one another to minimize capacitive coupling where it is desirable to reduce the distance between the two conductive plate layers 310, 312.

Each of the conductive plate layers 310, 312 is coupled to a respective test circuit 320, 322. As with the test circuit 220 (FIGS. 2 and 3), the test circuits 320, 322 couple the conductive plate layers 310, 312 to ground or to a test receiver 324, 326, all respectively, under the control of a test mode signal MODE. As previously discussed, under normal conditions, the conductive plate layers 310, 312 are coupled to ground to provide a well defined ground plane for the signal pads 202, 206. However, when a test mode is enabled, each of the conductive plate layers 310, 312 is coupled by the test circuit 320, 322 to the input of the test receiver 324, 326. As a signal, such as data signals D_OUT0, D_OUT1, are driven on the signal pads 202, 206, a corresponding signal can be detected at the conductive plate layers 310, 312 due to capacitive coupling. In response to detecting the corresponding data signals, each of the test receivers 324, 326 generates a test signal TEST_OUT0, TEST_OUT1, that can be provided to a respective conductive pad (not shown). Test equipment can be coupled via a conventional probe card to each of the conductive pads. Thus, in contrast to the semiconductor structure 200, the semiconductor structure 300 allows for evaluation and testing of multiple signals concurrently by the test equipment. In an alternative embodiment, the TEST_OUT0 and TEST_OUT1 signals are provided to a multiplexer (not shown) having an output coupled to a single conductive pad. Although additional circuitry in the form of control circuits and the multiplexer will need to be included to enable testing using the semiconductor structure 300, this arrangement does allow for concurrent application of a respective data signal to signal pads 202, 206.

Although FIG. 4 shows one signal pad 202, 206 coupled each conductive plate layer 310, 312, it will be appreciated that each of the conductive plate layers 310, 312 can be formed such that a plurality of signal pads can be capacitively coupled to each conductive plate layer 310, 312. In such an embodiment, testing of signals driven on signal pads associated with different conductive plate layers can be tested concurrently. However, testing of signals driven on the signal pads sharing the same conductive plate layers will need to be tested in the manner previously described with respect to the semiconductor structure 200.

Figure 5:
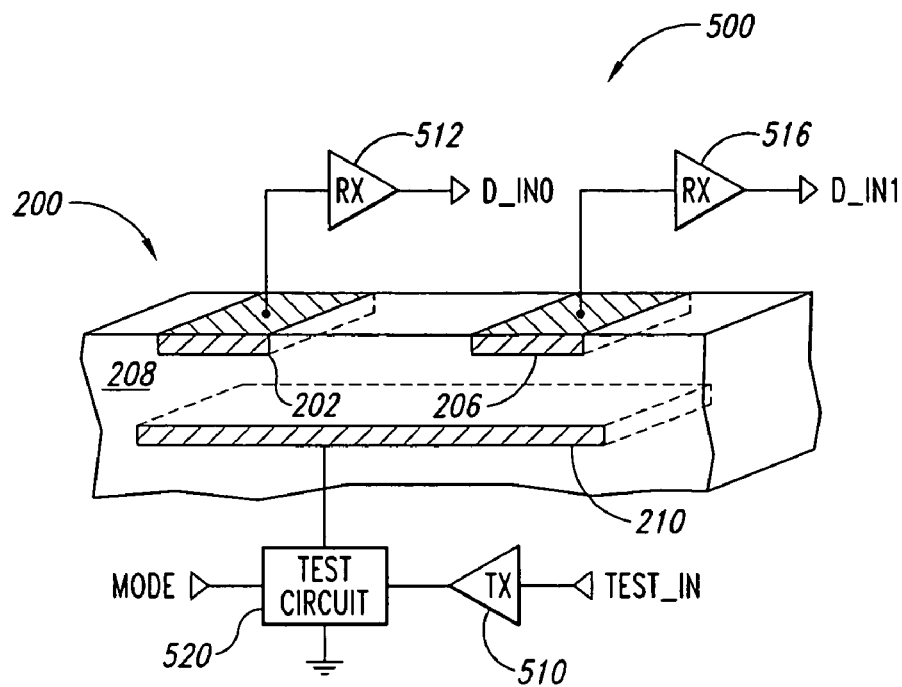
FIG. 5 is a partial isometric and cross-sectional view of a semiconductor structure according to another embodiment of the present invention for use in a capacitively coupled signaling system.

FIG. 5 illustrates a partial isometric and cross-sectional view of a semiconductor structure 500 according to another embodiment of the present invention which can be used with a capacitively coupled signaling system. The semiconductor structure 500 can be used to test the receivers and input circuitry of the semiconductor device on which the semiconductor structure 500 is included in a capacitively coupled test regime. The semiconductor structure 500 includes first and second signal pads 202, 206 formed over a conductive plate layer 210 on a dielectric material 208. The signal pads 202, 206 are coupled to receivers 512, 516, respectively, which generate input signals D_1N0, D_IN1 in response to signals applied to the signal pads 202, 206. The receivers 512, 516 generally represent circuitry formed on the semiconductor device on which the semiconductor structure 500 is located. The D_IN0, D_IN1 signals generated by the receivers 512, 516 are typically provided to other circuitry for further processing. The conductive plate layer 210 is coupled to a test circuit 220. The test circuit 220 receives a test mode signal MODE and couples the conductive plate layer 210 to the ground or to the output of a test transmitter 510. The test transmitter 510 couples an input test signal TEST_IN applied to its input to the conductive plate layer 210 during a test mode. The TEST_IN signal can be provided by a tester to a conductive pad (not shown) to which the input of the test transmitter 510 is coupled via a conventional probe card.

During test mode operation, the TEST_IN signal is applied to the conductive plate layer 210. The signal pads 202, 206 are capacitively coupled to the conductive plate layer 210, and consequently, the TEST_IN signal applied to the conductive plate layer 210 will be detected at the respective signal pads 202, 206. In response, the receivers 512, 516 will generate the D_IN0, D_IN1 signals, which can be evaluated by test equipment. In this manner of operation, variations in parasitic capacitance and leakage on the capacitively coupled input pin, represented by the signal pads 202, 206, can be detected. Moreover, the semiconductor structure 500 allows for evaluation and testing of input circuitry coupled to the receivers 512, 516 in a capacitively coupled test regime prior to die-to-die bonding with another device, such as in a SiP device.

In one embodiment, the output of the receivers 512, 516 are coupled to respective signal pads (not shown) that can be further coupled to test equipment in order to evaluate the signals received at the signal pads 202, 206. In another embodiment, the D_IN0, D_IN1 signals are multiplexed to a single signal pad (not shown) to which test equipment can be coupled to evaluate the signal received at the signal pads 202, 206. In another embodiment, the output of the receivers 512, 516 are coupled to circuitry for further processing. The output generated by the circuitry in response to receiving the D_IN0, D_IN1 signals can then be provided for evaluation. It will be appreciated by those ordinarily skilled in the art that the particular manner in which the signal received by the signal pads 202, 206 and the corresponding D_IN0, D_IN1 signals generated can be evaluated in different ways without departing from the scope of the present invention.

Figure 6:
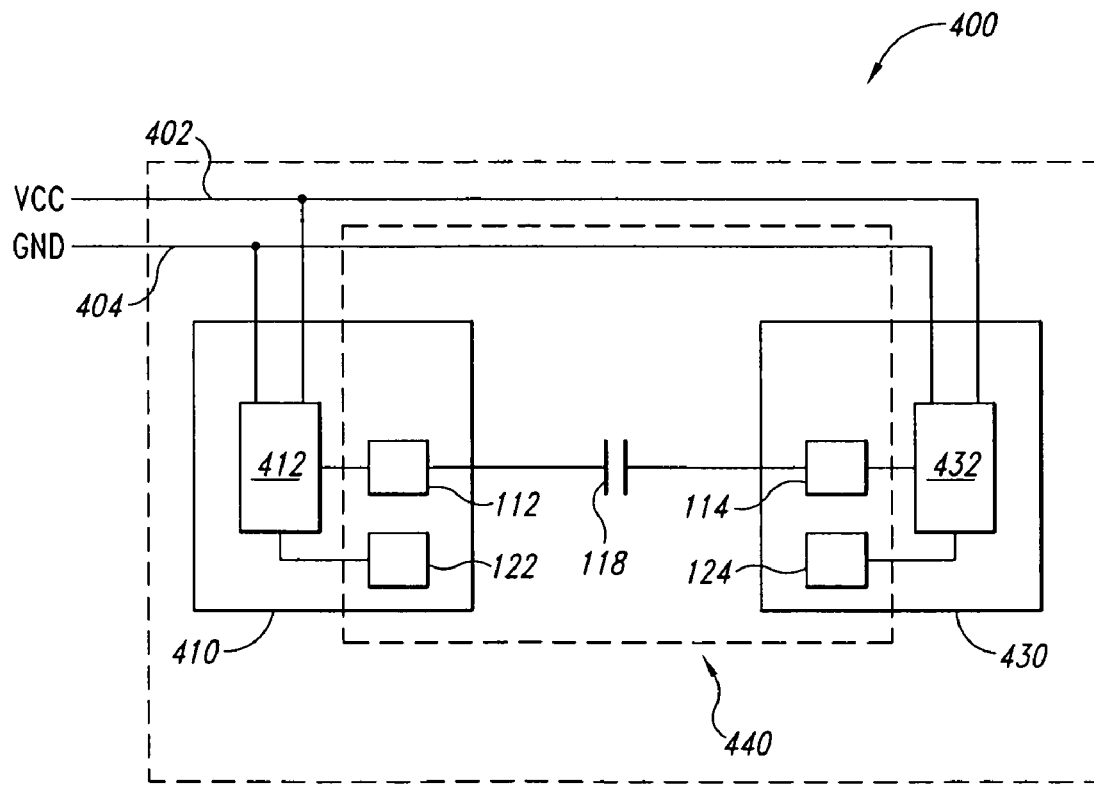
FIG. 6 is a block diagram of a system-in-package device including an embodiment of the present invention.

FIG. 6 illustrates a system-in-package (SiP) device 400 in which embodiments of the present invention can be implemented. The SiP device 400 includes a first discrete system 410 and a second discrete system 430. Both the first and second discrete systems 410, 430 are coupled to a voltage bus 402 and a ground bus 404 to provide power to the systems 410, 430. The first and second discrete systems 410, 430 include functional circuitry 412, 122 and 432, 124, respectively, that perform various operations. The functional circuitry 412, 122 and 432, 124 are conventional, and may include well known circuitry such as memory circuits, signal processing circuits, data processing circuits, mixed-signal circuits, and the like. The first and second discrete systems 410, 430 further include semiconductor structures according to an embodiment of the present invention to allow for testing of the respective discrete system in an AC test regime. The first and second discrete systems 410, 430 are coupled together using a capacitively coupled signaling system 440. The capacitively coupled signaling system 440 allows the first and second discrete systems 410, 430 to communicate with one another. It will be appreciated that FIG. 6 is merely representative of a SiP device, and additional circuitry, discrete systems, and signal lines can be included as well without departing from the scope of the present invention. For example, additional passive components (not shown), such as resistors and capacitors can be included for biasing, decoupling, bypassing, matching, and the like. Additional components have been omitted from FIG. 6 in order to avoid obscuring the present invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A test apparatus for testing a semiconductor device having a plurality of signal terminals from which a corresponding plurality of data signals are transmitted, the test apparatus comprising:
   a test plate for capacitively coupled to the signal terminals to detect transmitted data signals;
   a test engine coupled to the capacitively coupled test plate to evaluate data signals detected by the test plate from a signal terminal transmitting the data signal, the test engine commanding the semiconductor device to transmit in sequence a respective data signal from each of the plurality of signal terminals and further evaluating the respective detected data signals against test criteria; and
   a test circuit for decoupling the test plate from a voltage reference and coupling the test plate to a receiving circuit generating a test signal in response to detecting the data signals at the test plate.

2. The test apparatus of claim 1 wherein the semiconductor device is formed on a semiconductor die and the test plate comprises a conductive plate layer formed on the semiconductor die and the plurality of signal terminals comprises conductive signal pads formed in proximity to the conductive plate layer, the conductive plate layer separated from the conductive signal pads by a dielectric material.

3. The test apparatus of claim 1 wherein the test signal is coupled to a test terminal of the semiconductor device and the test engine is coupled to the test terminal to receive the test signal.

4. The test apparatus of claim 1, further comprising a test receiver electrically coupled between the test plate and the test engine, and the test receiver comprises a buffer circuit.

5. The test apparatus of claim 1 wherein the test engine comprises test circuitry to determine the functionality of transmitters applying a data signal to a respective signal terminal and the integrity of capacitors through which the signal terminals are capacitively coupled to the test plate.

6. The test apparatus of claim 1 wherein the test engine comprises test circuitry to compare the detected data signals against expected data signals.

* * * * *